United States Patent [19]

Deprez

[11] Patent Number: 6,160,624
[45] Date of Patent: Dec. 12, 2000

[54] METHOD FOR VERIFYING SILVER-BASED LITHOGRAPHIC PRINTING PLATES

[75] Inventor: Lode Deprez, Wachtebeke, Belgium

[73] Assignee: Agfa-Gevaert, N.V., Mortsel, Belgium

[21] Appl. No.: 09/083,884

[22] Filed: May 26, 1998

Related U.S. Application Data

[60] Provisional application No. 60/053,358, Jul. 17, 1997.

[30] Foreign Application Priority Data

Jun. 9, 1997 [EP] European Pat. Off. ............... 97201687

[51] Int. Cl.$^7$ ........................................................ G01J 3/46
[52] U.S. Cl. ............................................ 356/402; 356/422
[58] Field of Search .................................... 356/402, 419, 356/406, 429, 405

[56] References Cited

U.S. PATENT DOCUMENTS

| | | | |
|---|---|---|---|
| 5,015,098 | 5/1991 | Berg et al. ............................. | 356/402 |
| 5,283,157 | 2/1994 | Davies . | |
| 5,578,824 | 11/1996 | Koguchi et al. ........................ | 250/318 |

FOREIGN PATENT DOCUMENTS 0 736 808 A1   10/1996   European Pat. Off. .

OTHER PUBLICATIONS

Patent Abstracts of Japan, vol. 012, No. 354 (P–761), Sep. 22, 1988, and JP 63 106660 A (Mitsubishi Paper Mills Ltd), May 11, 1988.

*Primary Examiner*—Frank G. Font
*Assistant Examiner*—Roy M Punnoose
*Attorney, Agent, or Firm*—Breiner & Breiner

[57] ABSTRACT

A method is disclosed for verifying the printing quality of a lithographic printing plate which is obtained by a plate-making process whereby an ink-receptive silver image is formed at the printing areas, characterized in that said method comprises the step of matching the color of the silver image of said plate with a plurality of reference colors contained in a color reference system that provides information regarding the quality of silver-based lithographic printing plates having said reference colors. The color reference system may also provide information regarding the parameter(s) of the plate-making process so that said parameter(s) can be adjusted in order to improve the quality of the plates obtained by said process.

8 Claims, No Drawings

METHOD FOR VERIFYING SILVER-BASED LITHOGRAPHIC PRINTING PLATES

The application claims the benefit of U.S. Provisional Application No. 60/053,358 filed Jul. 17, 1997.

FIELD OF THE INVENTION

The present invention relates to a method for verifying the quality of silver-based lithographic printing plates by matching the color of the silver image with a color reference system.

BACKGROUND OF THE INVENTION

A preferred method of lithographic plate-making uses the so-called direct-to-plate systems which allow the direct exposure of the plate precursor instead of having to use a film intermediate as exposure mask. Materials that work according to the diffusion transfer reversal (DTR) process are highly preferred direct-to-plate systems since their high-speed and positive-working imaging process offers the high versatility of being exposed by projection camera's directly from the paste-up copy as well as by most commonly available laser image-setters currently used in graphic arts applications.

The principles of the DTR process have been described e.g. in U.S. Pat. No. 2,352,014 and in the book "Photographic Silver Halide Diffusion Processes" by André Rott and Edith Weyde—The Focal Press—London and New York, (1972). By DTR processing of an information-wise exposed silver halide material, non-developed silver halide present in the photosensitive emulsion layer of the material is transformed with a so-called silver halide solvent into soluble silver complex compounds which are allowed to diffuse into an image receiving element and are reduced therein with a developing agent, generally in the presence of physical development nuclei, to form a positive silver image having reversed image density values ("DTR image") with respect to the negative black silver image obtained in the exposed areas of the photographic material. In a preferred embodiment, said image receiving element is present in the same material as the photosensitive layer, thereby forming a so-called mono-sheet DTR material, though two-sheets embodiments are also known in the art.

Before processing, a typical DTR lithographic printing plate precursor is characterized by a hydrophilic surface, being water-receptive and non-wettable by ink. After processing, the silver particles that are formed in the image receiving layer at the unexposed areas are hydrophobic (oleophilic) and their ink-receptivity is further enhanced by hydrophobizing agents which are present in the processing liquid(s) so as to form an ink-receptive silver image at the printing areas of the plate.

The printing quality of the lithographic printing plate obtained after processing may be influenced by multiple parameters, e.g. the manufacturing process of the printing plate precursor and of the processing liquids, storage conditions of said precursor and liquids, processing parameters such as temperature, exhaustion of processing liquids due to evaporation, oxidation or non-optimal replenishment, maintenance of the processing apparatus, etc. Once the lithographic printing plate is obtained, its printing quality can not be adjusted anymore and a poor quality can only be remedied by making another plate. It would be advantageous to have a method for verifying the printing quality of the plate before starting the printing job. An even more preferred method should also provide information about the cause of a non-optimal quality by indicating the appropriate adjustments of the plate-making method in an effective and convenient way.

SUMMARY OF THE INVENTION

It is therefore a first object of the present invention to provide a method for verifying the printing quality of a lithographic printing plate which is obtained by a plate-making process whereby an ink-receptive silver image is formed at the printing areas. This object is realized by a method comprising the step of matching the color of the silver image of said plate with a plurality of reference colors contained in a color reference system that provides information regarding the quality of silver-based lithographic printing plates having said reference colors.

The above mentioned method is a convenient and elegant solution relying on the surprising result of the inventor's research that the printing quality of a silver-based printing plate is correlated with the color of the silver image at the printing areas. In a preferred embodiment, the color reference system also provides information regarding the parameter(s) of the plate-making process that need to be adjusted in order to optimize the printing quality of the plate obtained by said plate-making process.

It is another object of the present invention to provide a method for obtaining the above mentioned color reference system for verifying the printing quality of a lithographic printing plate. This object is realized by a method comprising the step of quantifying the silver image color of a plurality of reference plates in terms of device-independent color data. In a preferred embodiment, the color reference system reproduces the reference color by means of a color output device of which the color output signal values are obtained by transforming said device-independent color data in such a way that the reproduced colors match the reference colors accurately.

Further objects and advantages of the invention will become apparent from the description hereinafter.

Preferred embodiments of the invention are disclosed in the dependent claims.

DETAILED DESCRIPTION OF THE INVENTION

The specification "silver-based lithographic printing plate" as used herein means a printing plate, obtained by a plate-making process whereby an ink-receptive silver image is formed at the printing areas. As described above, a highly preferred plate-making method in accordance with the present invention is the silver salt diffusion transfer reversal (DTR) process which typically comprises the steps of image-wise exposing a DTR imaging element, the so-called printing plate precursor, and then treating said exposed element with (a) processing liquid(s).

The DTR image can be formed in the image receiving layer of a separate element with respect to the photographic silver halide emulsion material (a so-called two-sheet DTR element) or in the image receiving layer of a so-called single-support element, also called mono-sheet element, which contains at least one photographic silver halide emulsion layer as well as an image receiving layer in water-permeable relationship therewith. It is the latter mono-sheet type which is preferred for the preparation of offset printing plates by the DTR method.

Before dealing with the method claimed by the present invention, two preferred embodiments of an imaging element that may be used as a mono-sheet DTR offset printing plate precursor will be described hereinafter. According to a first type, disclosed in e.g. U.S. Pat. No. 4,722,535 and GB 1,241,661, an imaging element is provided comprising a support and coated thereon in the order given a silver halide emulsion layer and an image receiving layer containing physical development nuclei in water permeable relationship with said emulsion layer. Layers being in water-permeable contact with each other are hydrophilic layers that are contiguous to each other or only separated from each other by (a) water-permeable layer(s). The nature of a water-permeable layer is such that it does not substantially inhibit or restrain the diffusion of water or of compounds contained in an aqueous solution e.g. developing agents or complexed silver ions.

Supports suitable for use in said imaging elements may be opaque or transparent, e.g. a paper support or resin support. When a paper support is used, preference is given to one coated at one or both sides with an alpha-olefin polymer, e.g. a polyethylene layer which optionally contains an antihalation dye or pigment. It is also possible to use an organic resin support e.g. cellulose nitrate film, cellulose acetate film, polyvinylacetal film, polystyrene film, polyethyleneterephthalate film, polycarbonate film, polyvinylchloride film or poly-α-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used.

The photographic silver halide emulsion can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al. in "Making and Coating Photographic Emulsion", The Focal Press, London (1966). The emulsion preferably consists essentially or totally of silver chloride while a fraction of silver bromide may be present ranging from 0.1 molar % to 40 molar %. When the fraction of silver bromide is 5% or more, the emulsion preferably belongs to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. The average size of the silver halide grains may range from 0.10 to 0.70 $\mu$m, preferably from 0.25 to 0.45 $\mu$m. Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5 \times 10^{-7}$ and $10^{-5}$ mole per mole of $AgNO_3$.

The silver halide emulsion may be chemically sensitized according to the procedures described in e.g. "Chimie et Physique Photographique" by P. Glafkides, in "Photographic Emulsion Chemistry" by G. F. Duffin, in "Making and Coating Photographic Emulsion" by V. L. Zelikman et al, and in "Die Grundlagen der Photographischen Prozesse mit Silberhalogeniden" edited by H. Frieser and published by Akademische Verlagsgesellschaft (1968). As described in said literature chemical sensitization can be carried out by effecting the ripening in the presence of small amounts of compounds containing sulphur, selenium or tellurium e.g. thiosulphate, thiocyanate, thiourea, selenosulphate, selenocyanate, selenoureas, tellurosulphate, tellurocyanate, sulphites, mercapto compounds, and rhodamines. In a preferred embodiment, these compounds are applied in combination with a noble metal salt, preferably a gold complex salt, but also salts of platinum, palladium and iridium as described in U.S. Pat. No. 2,448,060 and British Patent No. 618,061 may be used. Additions of sulphur and/or selenium and/or tellurium and gold may be carried out consecutively or simultaneously. In the latter case the addition of gold thiosulphate, gold selenosulphate or gold tellurosulphate compounds may be recommended. Optionally, small amounts of compounds of Rh, Ru, Pb, Cd, Hg, or Tl can be added. Also reducing agents may be added as chemically sensitizing agents, e.g. tin compounds as described in British Patent No. 789 823, amines, hydrazine derivatives, formamidine-sulphinic acids, and silane compounds. The chemical sensitization can also proceed in the presence of phenidone and/or its derivatives, a dihydroxybenzene as hydroquinone, resorcinol, catechol and/or a derivative(s) thereof, one or more stabilizer(s) or antifoggant(s), one or more spectral sensitizer(s) or combinations of said ingredients.

The silver halide emulsion of the DTR element can be spectrally sensitized according to the spectral emission of the exposure source for which the DTR element is designed. Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes. In the case of a conventional light source, e.g. tungsten light, a green sensitizing dye is needed. In case of exposure by an argon ion laser a blue sensitizing dye is incorporated. In case of exposure by a red light emitting source, e.g. a LED or a He/Ne laser, a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888. A preferred blue sensitizing dye, green sensitizing dye, red sensitizing dye and infra-red sensitizing dye are described in EP-A 554,585.

To enhance the sensitivity in the red or near infra-red region use can be made of so-called supersensitizers in combination with red or infra-red sensitizing dyes. Suitable supersensitizers are described in Research Disclosure Vol. 289, May 1988, item 28952. The spectral sensitizes can be added to the silver halide emulsion in the form of an aqueous solution, a solution in an organic solvent or in the form of a dispersion.

The silver halide emulsion may contain the usual stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsion may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

More details about the composition, preparation and coating of silver halide emulsions can be found in e.g. Product Licensing Index, Vol. 92, December 1971, publication 9232, p. 107–109.

The image receiving layer can be free of hydrophilic binder but preferably comprises a hydrophilic amphoteric block copolymer as used in the present invention. Besides said block copolymer, the image receiving layer may contain other hydrophilic colloids such as polyvinyl alcohol up to an amount of about 80% by weight of the total weight of said layer. Other suitable hydrophilic polymer binders have been disclosed in e.g. U.S. Pat. Nos. 3,728,114; 4,160,670; 4,606,985; 4,510,228; 4,743,525; 4,879,193; 5,153,097; 5,108,871; 5,041,354. EP-A-715,211 and 751,429 disclose an image receiving layer comprising a colloidal clay in order to improve the lithographic properties of DTR plates.

The image receiving layer further contains physical development nuclei. Preferred physical development nuclei are sulphides of heavy metals e.g. sulphides of antimony, bismuth, cadmium, cobalt, lead, nickel, palladium, platinum, silver, and zinc. Especially suitable development nuclei are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form. As disclosed in EP-A-546,598 the physical development nuclei preferably have a narrow size distribution.

Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titanium dioxide can be present in the base layer. This layer can further contain hardening agents, matting agents, e.g. silica particles, and wetting agents. Suitable matting agents preferably have an average diameter of 2 to 10 µm and more preferably between 2 mm and 5 µm. The matting agents are generally used in a total amount in the imaging element of 0.1 g/m$^2$ to 2.5 g/m$^2$. At least part of these matting agents and/or light reflection pigments may also be present in the silver halide emulsion layer and/or in the cover layer. As a further alternative the light reflecting pigments may be present in a separate layer provided between the anti-halation layer and the photosensitive silver halide emulsion layer. Like the emulsion layer the base layer is coated preferably at a pH value near the isoelectric point of the gelatin in the base layer.

In the present embodiment a backing layer preferably is provided at the non-light sensitive side of the support. This layer which can serve as anti-curl layer can contain i.a. matting agents e.g. silica particles, lubricants, anti-static agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatines with different viscosity can be used to adjust the rheological properties of the layer. Like the emulsion layer the other hydrophilic layers are coated preferably at a pH value near the isoelectric point of the gelatin. But instead of or together with gelatin, one or more other natural and/or synthetic hydrophilic colloids may be used, e.g. albumin, casein, zein, polyvinyl alcohol, alginic acids or salts thereof, cellulose derivatives such as carboxymethyl cellulose, and modified gelatin such as phthaloyl gelatin.

The hydrophilic layers of the imaging element, especially when the binder used is gelatin, can be hardened with appropriate hardening agents such as those of the vinylsulphone type e.g. methylenebis(sulphonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in a wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element according to the present embodiment may further comprise various kinds of surface-active agents in the silver halide emulsion layer or in at least one other hydrophilic colloid layer. Examples of suitable surface-active agents are described in e.g. EP 545452. Preferably compounds containing perfluorinated alkyl groups are used. The imaging element of the present embodiment may further comprise various other additives such as e.g. compounds improving the dimensional stability of the imaging element, UV-absorbers, spacing agents and plasticisers.

Suitable additives for improving the dimensional stability of the imaging element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth) acrylates, sulphoalkyl (meth)acrylates, and styrene sulphonic acids.

The imaging element can be information-wise exposed in an apparatus using a camera-exposure or a scanning exposure according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element can also be exposed with the aid of cathode rays tubes and laser recorders or laser image-setters. The laser sources used comprise e.g. He/Ne or Ar gas lasers and red or infrared semiconductor lasers emitting in the wavelength range from 600 to 1500 nm.

The processing liquid used for developing the DTR imaging element are alkaline solutions which contain a silver halide solvent. Preferably the silver halide solvent is used in an amount between 0.01% by weight and 10% by weight and more preferably between 0.05% by weight and 8% by weight. Suitable silver halide solvents are e.g. 2-mercaptobenzoic acid, cyclic imides, oxazolidones and thiosulphates. Preferred silver halide solvents are thiocyanates and alkanolamines. Preferred alkanolamines are of the tertiary, secondary or primary type corresponding to the following formula:

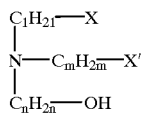

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, etc. or mixtures thereof. The alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

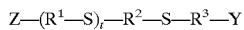

wherein Z and Y each independently represents hydrogen, an alkyl group, an amino group, an ammonium group, a hydroxyl, a sulpho group, a carboxyl, an aminocarbonyl or an aminosulphonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds are triazolium thiolates and more preferred 1,2,4-triazolium-3-thiolates. Preferably at least part and more preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l. However the meso-ionic compound may be incorporated in one or more layers comprised on the support of the imaging element. The meso-ionic compound is in that case preferably contained in the imaging element in a total amount between 0.1 and 10 mmol/m$^2$, more preferably between 0.1 and 5 mmol/m$^2$ and most preferably between 0.5 and 1.5 mmol/m$^2$. More details are disclosed in EP-A-0,554,585.

The alkaline processing liquid preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain (a) developing agent(s). In that case the processing liquid is called a developer. In another embodiment, some or all of the developing agent(s) may be present in one or more layers of the imaging element. When all of the developing agents are contained in the imaging element the processing liquid is called an activator or activating liquid. Silver halide developing agents are preferably of the p-dihydroxybenzene type, e.g. hydroquinone, methyl-hydroquinone or chlorohydroquinone, preferably in combination with an auxiliary developing agent being a 1-phenyl-3-pyrazolidone type developing agent and/or p-monomethylaminophenol. Particularly useful auxiliary developing agents are the 1-phenyl-3-pyrazolidones. Even more preferred, particularly when they are incorporated into the imaging element are 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used. At least the auxiliary developing agents are preferably incorporated into the imaging element, preferably in the silver halide emulsion layer of the imaging element, in an amount of less than 150 mg/g of silver halide expressed as $AgNO_3$, more preferably in an amount of less than 100 mg/g of silver halide expressed as $AgNO_3$.

The alkaline processing liquid used for developing an imaging element may also contain hydrophobizing agents for improving the hydrophobicity of the silver image obtained in the image receiving layer. The hydrophobizing agents are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents are those described in U.S. Pat. Nos. 3,776,728 and 4,563,410.

The hydrophobizing agents preferably are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having anti-oxidation activity, e.g. sulphite ions provided e.g. by sodium or potassium sulphite. For example, the aqueous solution comprises sodium sulphite in an amount ranging from 0.15 to 1.0 mole/l. The alkaline processing liquid may further contain a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. It is furthermore preferred to add a spreading agent or surfactant in order to assure equal spreading of the alkaline processing liquid over the surface of the imaging element. Such a surfactant should be stable at the pH of the alkaline processing liquid and should assure a fast overall wetting of the surface of the imaging element. A surfactant suitable for such purpose is e.g. a fluorine containing surfactant such as e.g. $C_7F_{15}COONH_4$. It is furthermore advantageous to add glycerine to the alkaline processing liquid so as to prevent crystallization of dissolved components. Development acceleration can be accomplished by addition of various compounds to the alkaline processing liquid and/or one or more layers of the imaging element, preferably polyalkylene derivatives having a molecular weight of at least 400 such as those described in e.g. U.S. Pat. Nos. 3,038,805; 4,038,075; 4,292,400 and 4,975,354.

Subsequent to the development in an alkaline processing liquid, the surface of the printing plate is preferably neutralized using a neutralization liquid, which is also called a stabilizer or stabilizing liquid. A neutralization liquid generally has a pH between 5 and 8. The neutralization liquid preferably contains a buffer e.g. a phosphate buffer, a citrate buffer or mixture thereof. The neutralization liquid can further contain bactericides, substances which influence the ink/water balance of the printing plate obtained after processing of the DTR element, e.g. hydrophobizing agents as described above, silica and wetting agents, preferably compounds containing perfluorinated alkyl groups.

After the neutralization step, the imaging element may optionally be rinsed with water. The rinsing water may comprise additives such as surface active ingredients or compounds which prevent growth of algae. After drying, a first embodiment of a lithographic plate which works according to the DTR mechanism is thus obtained.

According to another embodiment a lithographic printing plate can be obtained by means of the DTR process using an imaging element comprising in the order given a hydrophilic surface of a support, a layer containing physical development nuclei and a silver halide emulsion layer. Said hydrophilic surface of a support can be a hardened hydrophilic layer, containing a hydrophilic binder and a hardening agent coated on a flexible support, e.g. a paper support or a resin support as described above.

Such hydrophilic binders are disclosed in e.g. EP-A 450,199, which is incorporated herein by reference. Preferred hardened hydrophilic layers comprise partially modified dextrans or pullulan hardened with an aldehyde as disclosed in e.g. EP-A 514,990 which also is incorporated herein by reference. More preferred hydrophilic layers are layers of polyvinyl alcohol hardened with a tetra-alkyl orthosilicate and preferably containing $SiO_2$ and/or $TiO_2$ wherein the weight ratio between said polyvinylalcohol and said tetra-alkyl orthosilicate is between 0.5 and 5 as disclosed in e.g. GB-P 1,419,512, FR-P 2,300,354, U.S. Pat. Nos. 3,971,660, 4,284,705, EP-A 405,016 and EP-A 450, 199 which therefor are incorporated herein by reference.

Said hydrophilic surface of a support can also be a hydrophilic metallic support e.g. an aluminum foil. The aluminum support of the imaging element for use in accordance with the present embodiment can be made of pure aluminum or of an aluminium alloy, the aluminum content of which is at least 95%. The thickness of the support usually ranges from about 0.13 to about 0.50 mm. The preparation of aluminum or aluminum alloy foils for lithographic printing comprises the following steps: graining, anodizing, and optionally sealing of the foil. Graining and anodization of the foil are necessary to obtain a lithographic printing plate that allows to produce high-quality prints. Sealing is not necessary but may still improve the printing results. Preferably the aluminum foil has a roughness with a CLA value between 0.2 and 1.5 $\mu$m, an anodization layer with a thickness between 0.4 and 2.0 $\mu$m and is sealed with an aqueous bicarbonate solution. More details on the preparation of a grained, anodized and sealed aluminum foil are given in U.S. Pat. No. 3,861,917 and in the documents referred to therein.

To promote the image sharpness and, as a consequence thereof, the sharpness of the final printed copy, the anod-ization layer may be colored in the mass with an antihalation dye or pigment e.g. as described in JP-Pu-58,014, 797.

The silver halide emulsion and the physical development nuclei are characterized by the same features as described above. As binder in the silver halide emulsion layer(s) a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPas at a shearing rate of 1000 s$^{-1}$ combined with a gelatin of a higher viscosity. The weight ratio of said low viscosity gelatin versus the gelatin of a higher viscosity is preferably >0.5.

Preferably the gelatin layer(s) is(are) substantially unhardened. Substantially unhardened means that when such gelatin layer is coated on a subbed polyethylene terephthalate film base at a dry thickness of 1.2 g/m$^2$, dried for 3 days at 57° C. and 35% R.H. and dipped in water of 30° C., said gelatin layer is dissolved for more than 95% by weight within 5 minutes.

The imaging element of the present embodiment may be image-wise exposed using a camera or a scanning exposure as described above followed by a development step in the presence of development agent(s) and silver halide solvent (s) as described above so that a silver image is formed in the physical development nuclei layer. Subsequently the silver halide emulsion layer and any other optional hydrophilic layers are removed by e.g. rinsing the imaged element with water, preferably having a temperature between 30° C. and 50° C. so that the silver image is exposed.

To facilitate the removal of the silver halide emulsion layer it is advantageous to provide a layer between the layer containing physical development nuclei and the silver halide emulsion layer comprising a hydrophilic non-proteinic film-forming polymer e.g. polyvinyl alcohol, polymer beads e.g. poly(meth)acrylate beads, particles of a water insoluble inorganic compound having a number average size not lower than 0.1 $\mu$m, alkali insoluble non-polymeric organic compounds having a melting point of at least 50° C. and a number average size between 0.1 and 10 $\mu$m and particles of an alkali insoluble polymer obtainable by polycondensation with a number average size between 0.02 and 10 $\mu$m. Such type of layers are disclosed in EP-A-483415, EP-A-410500, EP-A-723195, EP-A-750227 and EP-A-773,474.

Finally the imaging element is treated with a composition often called finisher, which comprises at least one compound enhancing the ink-receptivity and/or lacquer-receptivity of the silver image and at least one compound that improves the ink-repelling characteristics of the hydrophilic surface. Suitable ingredients for the finisher are e.g. organic compounds containing a mercapto group such as the hydrophobizing compounds referred to hereinbefore for the alkaline processing liquid. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellence of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkish red oil may be added.

A second embodiment of a lithographic printing plate which works according to the DTR mechanism is thus obtained.

Turning to the method for verifying the printing quality of silver-based lithographic printing plates as claimed by the present invention, it is to be understood that it is not intended to limit the invention to the preferred embodiments of silver-based lithographic printing plate precursors described above.

It is known in the art that the printing quality of silver-based lithographic printing plates is highly determined by the physical and chemical properties of the silver image that forms the printing areas of the plate, in particular the silver particles forming said image. The present invention discloses the hitherto unknown solution that the color of the silver image can be used as a reliable indicator of the printing quality of a silver-based lithographic printing plate. A good printing quality is manifested by a number of features, such as a high printing endurance, low staining (ink-acceptance at the non-printing areas) and good inking-up quality (i.e. a low number of useless prints during start-up of the printing run due to poor ink-acceptance at the printing areas).

The color of the silver image of the plate which is being matched with the color reference system in the method according to the present invention is referred to hereinafter as "sample color". The silver image colors which are contained in the color reference system are referred to as "reference colors". Said reference colors are the silver image colors of a plurality of so-called "reference plates", which are each made with varying adjustments of the parameter(s) that influence(s) the plate-making process. In that way, a set of reference plates is obtained with different printing quality and different silver image colors, which can be used as reference colors. The printing quality of the reference plates is determined using the conventional quality measurement procedures. Reference is made to the examples, which give a description of the manufacturing process of a possible set of "reference plates" and their corresponding printing quality.

Once the correlation between the color of the silver image of a silver-based lithographic printing plate and the corresponding printing quality is known, this correlation is used according to the present invention for verifying the printing quality of any sample plate of the same kind as the reference plates by matching the sample color with the reference colors. Said match can be established in several ways, ranging from fully automatic colorimetry to visual comparison. Some possible methods are described hereinafter in more detail.

The most reliable color matching methods rely on the quantification of colors in terms of device-independent color data, such as the co-ordinates of the 1976 CIE (Commission Internationale de l'Eclairage) color spaces (L*,u*,v*) or (L*,a*,b*) (the latter also called CIELAB color space). These color spaces are derived from the earlier 1931 CIE (x,y,z) color space based on the so-called CIE Standard Observer Data obtained by averaging the results from investigations on color matching by 17 non-color-defective observers and on the relative luminance of the colors of the spectrum averaged for about a hundred observers. In the CIELAB color space the co-ordinate L* represents the CIE lightness and the co-ordinates a* and b* relate to the 1976 CIE chroma C* and 1976 CIE hue-angle h according to the formulae $C^*=(a^{*2}+b^{*2})^{1/2}$ and $h=\arctan(b^*/a^*)$.

The above mentioned matching step may be performed fully automatic by quantifying the sample color and then comparing its co-ordinates with those of the reference colors that are stored in the color reference system, which may e.g. be an electronic device such as a personal computer which is coupled to the colorimeter used to quantify the sample color. Said comparison can be done by calculating the color difference between the sample color and each of the reference colors, the best matching reference color being the one that has the lowest color difference. Said color difference is e.g. the 1976 CIELAB color difference $\Delta E^*$ defined by the following formula:

$$\Delta E^* = [(\Delta L^*)^2 + (\Delta a^*)^2 + (\Delta b^*)^2]^{1/2}$$

wherein each $\Delta$ is the difference of the color co-ordinate of the sample color and the reference color. In accordance with the above mentioned definition of chroma C* and hue-angle h, the above formula for calculating the color difference can also be written as follows:

$$\Delta E^* = [(\Delta L^*)^2 + (\Delta C^*)^2 + (\Delta h)^2]^{1/2}$$

A more elegant though less accurate embodiment of the color reference system used in the method according to the present invention, is a so-called "color reference card", i.e. a hard copy which represents a plurality of reference colors. The best match between the sample color and the reference colors on the card can be established simply by visual comparison. In a preferred embodiment, the reference colors are printed on the color reference card by means of a color management method using conversion tables to transform the device-independent color co-ordinates of the reference colors into device dependent color output signals, i.e. the CMYK values (Cyan, Magenta, Yellow and Black) of the particular printing device. Examples of such color management methods are well known in the art and are used in many color reproduction devices, such as displays, printers, copiers, etc. Most personal computer systems that need to reproduce colors accurately are set up with color management software such as APPLE ColorSync® or AGFA Foto-Tune®. More details on this embodiment of the present invention using a color reference card are given in the examples.

In another embodiment, the elegant solution of using a color reference card is kept, but the accuracy of matching the sample color with the reference colors on said card is increased by replacing the human observer by a calorimeter which determines the color difference between the sample color and each reference color on said card in terms of device-independent data as described above. Other embodiments of color reference systems that reproduce the reference colors accurately may be CRT's, LCD's or other color image displays.

After establishing which reference color best matches the sample color, the user can predict the printing quality of the sample plate from the information provided by the color reference system regarding the printing quality of a plate having such a sample color. In a preferred embodiment, the color reference system also provides information regarding the parameter(s) of the plate-making process that need(s) to be adjusted in order to improve the quality of the plates obtained by said process. The present invention thus also provides a process for making silver-based lithographic printing plates that can be optimized by using the verification methods described above.

EXAMPLES

Preparation of the Silver Halide Emulsion Coating Solution

A silver chlorobromide emulsion composed of 98.2 molar % of chloride and 1.8 molar % of bromide was prepared by the double-jet precipitation method. The average silver halide grain size was 0.38 μm (diameter of a sphere with equivalent volume) and contained rhodium ions as internal dopant. The emulsion was ortho-chromatically sensitized and stabilized with a 1-phenyl-5-mercapto-tetrazole.

Preparation of the Reference Plate Precursors

A polyethylene terephthalate film support having a thickness of 175 μm and being provided with a adhesion improving layer was coated with a layer containing gelatin in an amount of 0.4 g/m² and colloidal silica having an average particle diameter of 7 nm in an amount of 0.4 g/m². The adhesion improving layer contained a copolymer of itaconic acid (2%), vinylidene chloride (88%) and methylmethacrylate (10%). An emulsion prepared as described above was coated onto this polyethylene terephthalate film support together with an anti-halation layer such that the amount of gelatin was 2.8 g/m² in the anti-halation layer and 1.34 g/m² in the silver halide emulsion layer. The amount of silver halide expressed as $AgNO_3$ was 1.25 g/m² and the emulsion layer further contained developing agents, a silica matting agent and 150 mg/m² of formaldehyde as a hardener. The anti-halation layer further contained $BaSO_4$-particles having a size smaller than 800 nm (4 g/m²) in combination with carbon black. The anti-halation layer was substantially free of matting agent. The thus obtained element was kept at 57° C. at a relative humidity of 34% for 1 day. To this sample was then coated an image receiving layer of PdS nuclei prepared as described in EP-545,453. The coating solution of the image receiving layer contained an amount of synthetic clay (Laponite® RD, trade mark products of LAPORTE INDUSTRIES Limited, London) of 2 mg/m². This surface layer also contained 0.4 g/m² of hydroquinone and was substantially free of any hardening. The samples were then stored for 1 day at 57° C. at a relative humidity of 34%.

Preparation of the Treating Solutions

| The following alkaline processing liquid was prepared: | |
|---|---|
| sodium sulphite anhydrous | 35 g |
| EDTA, tetra-sodium salt | 1 g |
| 2-aminoethyl-aminoethanol | 45 ml |
| sodium hydroxide | 30 g |
| 1,4-dimethyl-5-(3-butenyl)-1,2,4-triazolium-3-thiolate | 0.8 g |
| 5-n.heptyl-2-mercapto-3,4-oxadiazole | 0.35 g |
| methylhydroquinone | 2 g |
| water to make | 1 liter |
| The following neutralization liquid was prepared: | |
| Synperonic ® PE-L35 (a) | 200 mg |
| tri-ethanolamine | 10 ml |
| sodium sulphite anhydrous | 4 g |
| 1-(α-(N,N-dibutyl)acetylamide)-5-mercapto-1,2,3,4-tetrazole | 800 mg |
| EDTA, tetra-sodium salt | 1 g |
| sodium benzoate | 1 g |
| Turpinal ® 2NZ (b) | 1 g |
| sodiumdihydrogen phosphate | 1.1 g |
| potassiumdihydrogen phosphate | 38.3 g |
| citric acid | 5.4 g |
| sodium hydroxide | 1.05 g |
| water to make | 1 liter |
| pH was adjusted to 5.9 | |
| The following dampening liquid was prepared: | |
| water | 880 ml |
| citric acid | 6 g |
| boric acid | 8.4 g |
| sodium sulphate, anhydrous | 25 g |
| ethyleneglycol | 100 g |
| colloidal silica | 28 g |

(a) Synperonic PE-L35 is a non-ionic surfactant, trade name of ICI.
(b) Turpinal 2NZ is a trade name of HENKEL, Belgium for 1-hydroxyethylidene-diphosphonic acid, disodium salt.

Preparation of the Reference Plates and Test Results

The material obtained was divided into five samples and each sample was used as a precursor to prepare a reference printing plate by image-wise exposing and processing with the alkaline processing liquid and neutralization liquid described above, then rinsed with water and dried. Plate no. 1 was made with optimal settings of all parameters of the plate-making process. The other plates were made by adjusting a parameter of the plate-making process as indicated in Table 1 so as to obtain five reference plates with different printing quality and different silver image color. Unless otherwise indicated, the printing plate precursor materials were kept at normal atmospheric conditions before plate-making and fresh processing liquids were used at a processing temperature of 30° C. Plate no. 2 was made by processing at too low a temperature (18° C.). Plate no. 3 was made identically as plate no. 1 but stored after processing during 10 days at 35° C. and 80% relative humidity. Plate precursor no. 4 was pre-fogged before exposure so that part of its silver content can not diffuse to the image receiving layer and then processed as plate no. 1. Plate no. 5 was obtained by processing with liquids that were exhausted with at least 10 m² of precursor.

In order to evaluate the printing quality, the reference plates were mounted on a AB DICK 9860 offset printing machine (trade name of AB DICK Co.). During the printing run, AB DICK 1020 black ink was applied onto the plates together with a fountain solution obtained by diluting the dampening liquid described above to an amount of 5% by volume. The "inking-up" quality of the reference plates was evaluated by counting the number of copies that had to be disposed of before a steady, perfect black print could be obtained. The printing endurance was evaluated as the number of printed copies obtained before occurrence of loss of small details on the copy. The test results are listed in Table 1. The printing endurance of plate no.2 could not be established due to its inferior inking-up quality.

Table 1 also indicates the visual perception by a human observer of the silver image color at the printing areas of the reference plates. These reference colors were quantified in CIELAB co-ordinates by means of a GRETAG SPM-50 calorimeter analyzing the reflectance spectrum at an angle of 45°. A color reference card was made as described above by transforming said CIELAB co-ordinates to device-specific CMYK values of a TEKTRONIX 440 Phaser® color printer (values listed in Table 1) and then printing the five reference colors next to the plate-making parameter which was responsible for the silver color obtained (as given in the first column of Table 1). The color reference card thus obtained can now be used for determining the printing quality of similar silver-based lithographic printing plates as the reference plates described above and for optimizing the plate-making process.

Having described in detail preferred embodiments, it will now be apparent to those skilled in the art that numerous modifications can be made without departing from the scope of the present invention. As an example, also an unexposed or partially exposed plate may be used as test plate for verifying the quality of the plate-making process. Such an unexposed area of a plate does not contain a silver "image" in the literal sense but is ink-receptive over the whole unexposed area. It shall be understood that matching the silver color of said unexposed area with a color reference system for verifying the printing quality of the plate is considered to be equivalent to the method of the present invention and is covered by the scope of the following claims.

TABLE 1

| Plate No. | Plate-making parameter | Printing endurance | Inking-up | Silver color | L* | a* | b* | C | M | Y | K |
|---|---|---|---|---|---|---|---|---|---|---|---|
| 1 | All parameters optimal | >15,000 | <10 | blue | 58 | −2, 4 | −5.8 | 28 | 3 | 10 | 44 |
| 2 | Processing temperature 18° C. | — | >100 | yellowish | 62 | −3.8 | −0.1 | 20 | 2 | 15 | 41 |
| 3 | Plate stored 10 days at 35° C./85% R.H. | <2000 | <10 | gray | 59 | −1.5 | −2.1 | 19 | 5 | 12 | 45 |
| 4 | Plate precursor pre-fogged | <2000 | <10 | gray | 60 | −1.6 | −3.5 | 22 | 4 | 11 | 43 |
| 5 | Chemistry exhausted | <5000 | ±25 | yellowish | 57 | −3.0 | +1.2 | 16 | 4 | 15 | 50 |

What is claimed is:

1. A method for verifying the printing quality of a lithographic printing plate having printing and non-printing areas and which is obtained by a plate-making process whereby an ink-receptive silver image is formed at the printing areas, said method comprising the step of matching the silver image color of said plate with a plurality of reference colors contained in a color reference system that provides information regarding the printing quality of silver-based lithographic printing plates.

2. A method according to claim 1 wherein the color reference system also provides information regarding a paramater of the plate-making process that needs to be adjusted in order to optimize the printing quality of the plate obtained by said plate-making process.

3. A method according to claim 1 wherein the color reference system is a color reference card representing a plurality of reference colors and wherein the step of matching the color of the silver image of the plate with a plurality of reference colors is performed by visual comparison with the reference colors on said color reference card.

4. A method for making a color reference system for verifying the printing quality of a lithographic printing plate having printing and non-printing areas and which is obtained by a plate-making process whereby an ink-receptive silver image is formed at the printing areas, said method comprising the step of quantifying the silver image color of a plurality of reference plates in terms of device-independent color data.

5. A method according to claim 4 wherein the color reference system is a system reproducing a plurality of reference colors by means of a color output device of which the output signals are obtained by transforming the device-independent color data of the reference color into device-specific color data of said output device.

6. A method according to claim 5 wherein the color reference system is a color reference card representing a plurality of reference colors, said reference colors being printed on said card by a color printing device of which the CMYK values are obtained by transforming the device-independent color data of the reference colors into device-specific color data of said printing device.

7. A method for verifying the printing quality of a lithographic printing plate having printing and non-printing areas and which is obtained by a plate-making process whereby an ink-receptive silver image is formed at the printing areas, said method comprising the step of matching the silver-image color of said plate with a plurality of reference colors contained in a color reference system that provides information regarding the printing quality of silver-based lithographic printing plates, wherein said color reference system is obtained by quantifying the silver image color of a plurality of reference plates in terms of device-independent color data.

8. A method according to claim 7 wherein the step of matching the color of the silver image of the plate with a plurality of reference colors is performed by quantifying the color of the silver image of said plate in terms of device-independent color co-ordinates and determining the color difference between the device-independent color co-ordinates of said plate and the ones of the reference colors contained in the color reference system.

* * * * *